United States Patent [19]
Liu

[11] Patent Number: 6,028,323
[45] Date of Patent: Feb. 22, 2000

[54] QUANTUM WELL INFARED IMAGE CONVERSION PANEL AND ASSOCIATED METHODS

[75] Inventor: Hui-Chun Liu, Orleans, Canada

[73] Assignee: National Research Council of Canada, Ottawa, Canada

[21] Appl. No.: 08/896,170

[22] Filed: Jul. 17, 1997

Related U.S. Application Data

[60] Provisional application No. 60/020,981, Jul. 19, 1996.

[51] Int. Cl.[7] .............................. H01L 29/06; H01L 27/15
[52] U.S. Cl. ................................ 257/21; 257/80; 257/84; 257/85; 257/432; 257/460
[58] Field of Search .................................. 257/80, 81, 82, 257/84, 85, 98, 432, 447, 460, 21, 14

[56] References Cited

PUBLICATIONS

Integrated quantum well intersub–band photodetector and light emitting diode, H.C. Liu; J. Li; Z.R. Wasilewski; M. Buchanan. Electronics Letters, May 11, 1995 vol. 31, No. 10, p. 832–833.
Pixelless infrared imaging device. H.C. Liu; L.B. Allard; M. Buchanan; Z.R. Wasilewski Electronics Letters, Feb. 27, 1997 vol. 33, No. 5. p. 379–380.
Pixelless infrared imaging utilizing a p–type quantum well infrared photodetector integrated with alight emitting diode. L B. Allard; H.C. Liu; M. Buchanan; Z.R. Wasilewski. App. Phy. Lett. 70(21), May 26, 1997.
Infrared Technology XXI.. H.C. Liu J. Li; Z.R. Wasilewski; M. Buchanan. Society of Photo–Optical Instrumentation Engineers Jul. 9–13, 1995, San Diego, California.
Photodetectors; Materials and Devices II. Society of Photo–Optical Instrumentaion Engineers Feb. 12–14, 1997, San Jose, California.

*Primary Examiner*—Minh Loan Tran
*Attorney, Agent, or Firm*—Neil Teitelbaum & Associates

[57] ABSTRACT

A method for infrared (IR) imaging using a panel made of integrated GaAs quantum well infrared photodetector (QWIP) and near-infrared (NIR) or visible light emitting diode (LED). The panel is a large area diode with an optical window for top illumination or without the window for backside illumination. The integrated device acts as a photon energy up-converter which converts infrared light of wavelength longer than about 1.1 $\mu$m to near infrared or visible light which falls into the silicon detector spectral range. Using this device, an IR image is up-converted and the resulting NIR or visible image is then detected by an off-the-shelf silicon charge-coupled-device (CCD) camera The image detected on the CCD camera represents the original infrared image. A specific device embodiment for converting 9 $\mu$m IR to 870 nm NIR is given. Using this up-conversion scheme a multicolor or multispectral version is easily realized, which provides the capability of simultaneously imaging in several infrared wavelength regions. The imaging panel can also be used with other forms of photodetectors.

9 Claims, 9 Drawing Sheets

Two-Color Embodiment

GaAs substrate

QUANTUM WELL INFARED IMAGE CONVERSION PANEL AND ASSOCIATED METHODS

This application claims benefit of Provisional Application 60/020,981, filed Jul. 19, 1996.

FIELD OF THE INVENTION

The present invention relates generally to up-conversion of IR energy.

BACKGROUND OF THE INVENTION

Infrared imaging is widely used in a variety of applications including night vision, surveillance, search and rescue, remote sensing, and preventive maintenance, to name a few. Imaging devices to provide these applications are typically constructed of HgCdTe or InSb focal plane arrays. These focal plane arrays are known to be pixel mapped devices, where an array element is generally mapped to one or more circuit elements. However, such focal plane arrays are difficult to manufacture and expensive. Quantum well infrared photodetectors (QWIPs) can detect mid and far infrared light, providing an output current as a result. However, such devices have not been able to be successfully used in efficient and inexpensive arrays to provide a practical imaging detector. QWIP devices are described in U.S. Pat. No. 4,873,555, issued Oct. 10, 1989 to the University of Pittsburgh and in U.S. Pat. No. 4,894,526 issued Jan. 16, 1990 to American Telephone and Telegraph Company, AT&T Bell Laboratories. The latter patent describes an improved efficiency device, which utilizes a series of quantum wells.

An improvement on these earlier technologies was disclosed by the applicant, H. C. Liu, in U.S. Pat. No. 5,567,955 issued Oct. 22, 1996 to the National Research Council of Canada, incorporated herein by reference, wherein the vertical integration of a light emitting diode (LED) with a QWIP is described. Current from the QWIP device resulting from the impingement of far-infrared (FIR) causing the LED to emit near-infrared (NIR) energy. This energy can be efficiently detected by a silicon CCD, resulting in a highly efficient detector. In the aforementioned patent, the applicant describes a FIR to NIR energy converter comprised of a QWIP photodetector integrated vertically with a LED. The integration results from epitaxial deposition of the LED material over the QWIP materials. The device described by the applicant in this earlier U.S. Pat. No. 5,567,955 relates to a transmissive device having a substantially transparent substrate.

However, in certain applications that will be described hereafter, it may be preferable to provide a device wherein the input FIR energy is launched into a same side (face) of the device as the up-converted NIR energy exits. More specifically, in a device, in accordance with this invention, wherein a large single QWIP-LED is provided, to be used as a pixelless means of up-converting and imaging a FIR beam to a NIR beam, means or measures must be provided to insure that unwanted distortion, smearing or shadowing of the image do not occur. Typical, substrates that are sufficiently thin to allow FIR energy to pass therethrough have been in the range of 300 $\mu$m to 1 mm. However, providing a large single QWIP-LED in accordance with this invention, as a transmission device and using a substrate having a thickness as great as 300 $\mu$m or greater, will result in images that are not absent of smearing and shadowing. Therefore, it is an object of this invention to provide a large QWIP-LED for use in up-converting and imaging input energy having a very thin substrate that will not cause smearing or shadowing.

It is an object of the invention, to provide a device wherein input FIR energy is launched into a same face as up-converted NIR energy exits.

It is a further object of the invention to provide a device that is less susceptible to blurring or smearing effects caused by using a standard transmissive substrate.

In U.S. Pat. No. 5,567,955, the applicant, H. C. Liu, describes system that is "pixelized" wherein a plurality of QWIP-LEDs are fabricated on a single device, adjacent one another. The QWIP-LED elements are shown in the form of an array of closely spaced elements. In operation the energy in FIR wavelength to be detected passes through the transparent substrate 3 and is detected by each sub-QWIP exposed to the energy. The resulting photocurrents pass through the associated sub-LEDs causing them to emit energy of e.g. NIR. This NIR energy is detected by the CCD, and is processed for display in a well-known manner. In this prior art device, each QWIP-LED provides a single pixel of information to one or more CCD detectors. Although this device performs its intended function, it was found to be complicated, difficult manufacture, and costly. It is therefore an object of this invention to provide a device wherein a single QWIP-LED provides a pixelless image to a detection means such as an array of CCD elements capable of distinguishing and capturing a plurality of values from a single QWIP-LED. Thus, a novel aspect of this invention is the provision of a QWIP-LED, that is large enough to provide a pixelless beam for transporting an image to a capture means capable of recording a plurality of different detected values representative of the image within the beam. The invention also provides means of designing the QWIP-LED such that blurring and ghosting are minimized.

Methods for making GaAs-based QWIPs are well known, and have been taught in the cited patents. U.S. Pat. No. 4,873,555 teaches the basic methods for making a single-well detector, and introduces the new idea of using intraband or intersubband transitions for IR detection. U.S. Pat. No. 4,894,526 deals with a multiple quantum well detector. The details of the physics of QWIPs are found in the review article by Liu published as a book chapter in "Long Wavelength Infrared Detectors" edited by Razeghi. GaAs-based LEDs and Si CCD are widely available commercial products, and the basic physics and operation of these devices are discussed in standard text books, for example, in Secs. 12.3 and 7.4 of "Physics of Semiconductor Devices" by Sze.

Recently, a GaAs-based QWIP operating at a peak wavelength of 9 $\mu$m has been integrated with a GaAs-based LED in the near infrared region, as published by Liu et al. in Electron. Lett., Vol. 31, pp. 832–833, 1995. The single element device described in this paper is functionally an IR to NIR up-converter. The incident IR causes an increase in the NIR emission intensity. The operation principle of this device is summarized below. A conventional QWIP works as a photoconductor, i.e., its resistance changes (usually decreases) when IR light of appropriate wavelength is launched onto the QWIP. A bias voltage is needed so that the QWIP operates at its optimum detection point. A standard LED emits light when biased close or beyond the flat band condition. Modem III–V epitaxial growth techniques such as GaAs-based molecular beam epitaxy (MBE) can grow both a QWIP and a LED onto the same wafer in a single stack. If one stacks a QWIP and a LED together by growth, one achieves a serially connected QWIP-LED. Applying a forward bias to this serial device results in turning both the QWIP and the LED into their operating conditions.

Prior art FIG. 1 illustrates in schematic a QWIP 1, having a series of quantum wells as described in the aforenoted U.S.

Pat. No. 4,894,526, epitaxially grown on a substrate 3. An LED 5 is epitaxially grown on the QWIP. The substrate 3 is sufficiently thin and sufficiently transparent (i.e. 500—μm) so as to allow FIR energy to pass through it to the QWIP 1.

It should be noted that the term FIR energy is intended in this specification to include mid infrared energy (MIR) of 3–12 μm wavelength. FIR and MIR thus is used interchangeably in this specification. The NIR wavelength is approximately 800–1000 nm. Upon application of a bias current, e.g. from a battery 7 via a load resistor 9, to the stacked QWIP and LED in series, the same current passes through both. FIR generates photocurrent in the QWIP device, which passes into the LED.

This photocurrent arises from the external bias current, since the QWIP device changes resistance (usually decreases) when infrared light of the appropriate wavelength is launched onto the QWIP. This photocurrent generates or increases NIR emission from the LED, which emission can be detected by a detector that completes the thermal imaging device.

Absorption of infrared light at $\lambda_{MIR}$ results in an increase of the current flow in the QWIP device. This increase in current must increase the current through the LED since they are serially connected. Because the LED is biased near or beyond the flat band condition the additional current will give rise to turning on or increasing the LED near-infrared light emission. The mid-infrared light has thus been converted into a near-infrared light, which can be detected by a Si CCD.

Prior art FIG. 2 shows a cross section of a QWIP device and LED subdivided into an array of sub-QWIPs 11 and sub-LEDs 13, epitaxially deposited on a substrate forming mesas each of which is comprised of a sub-QWIP and sub-LED.

SUMMARY OF THE INVENTION

In accordance with this invention, and as is shown in FIG. 4a and FIG. 4b, a large diode (for example 10 mm×10 mm) with an optical window of approximately the same dimensions is used as an up conversion panel.

In accordance with the invention, there is provided, an imaging system comprising a single QWIP-LED, the LED having an emitting surface dimension of approximately 2 mm×2 mm or greater, and an image capture means positioned to capture a plurality of different intensity values from the single QWIP-LED.

In accordance with another aspect of the invention, a single QWIP-LED is provided that can provide a plurality of different signals to a plurality of different cells in a CCD in response to the input infrared beam that varies across two dimensions of its cross section.

And yet in a broad aspect of the invention, a device for up-converting an input beam including a single LED is provided for providing a plurality of different signals to a plurality of different cells in an image capture means in response to an input beam that varies across two dimensions of its cross section.

In yet a broader aspect of the invention, a single photodetector device having an output surface of approximately 2 mm×2 mm or more for detecting an input IR beam and for providing a plurality of electrical currents corresponding to the beam intensity is provided for coupling to a means of detecting the plurality of electrical currents.

DETAILED DESCRIPTION

Figure 1:
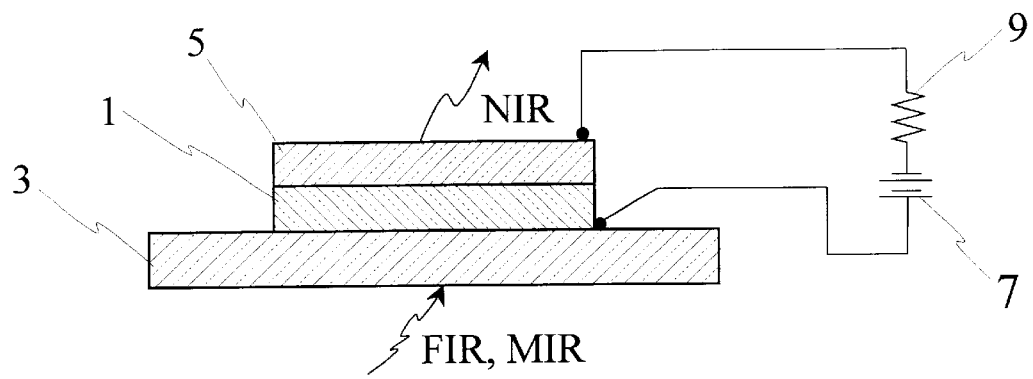
FIG. 1 is a prior art representative cross-section (not to scale) of a FIR to NIR conversion device.
Figure 2:
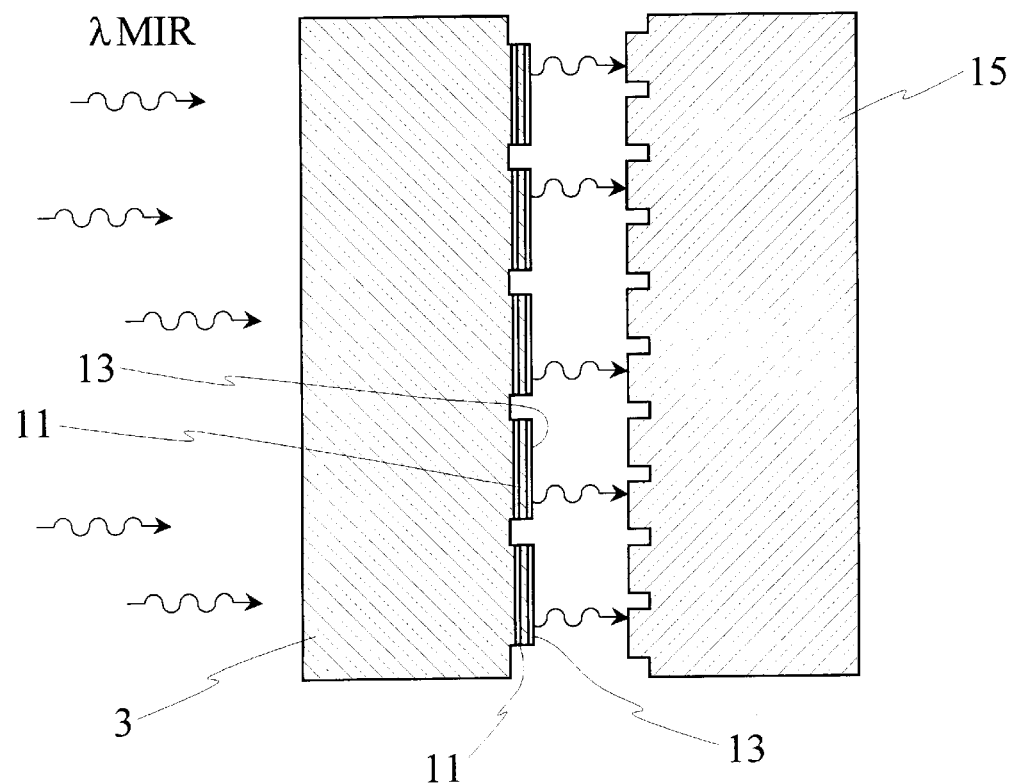
FIG. 2 is a prior art representative cross-section (not to scale) of an array of FIR to NIR conversion elements juxtaposed an array of CCD elements.
Figure 3:
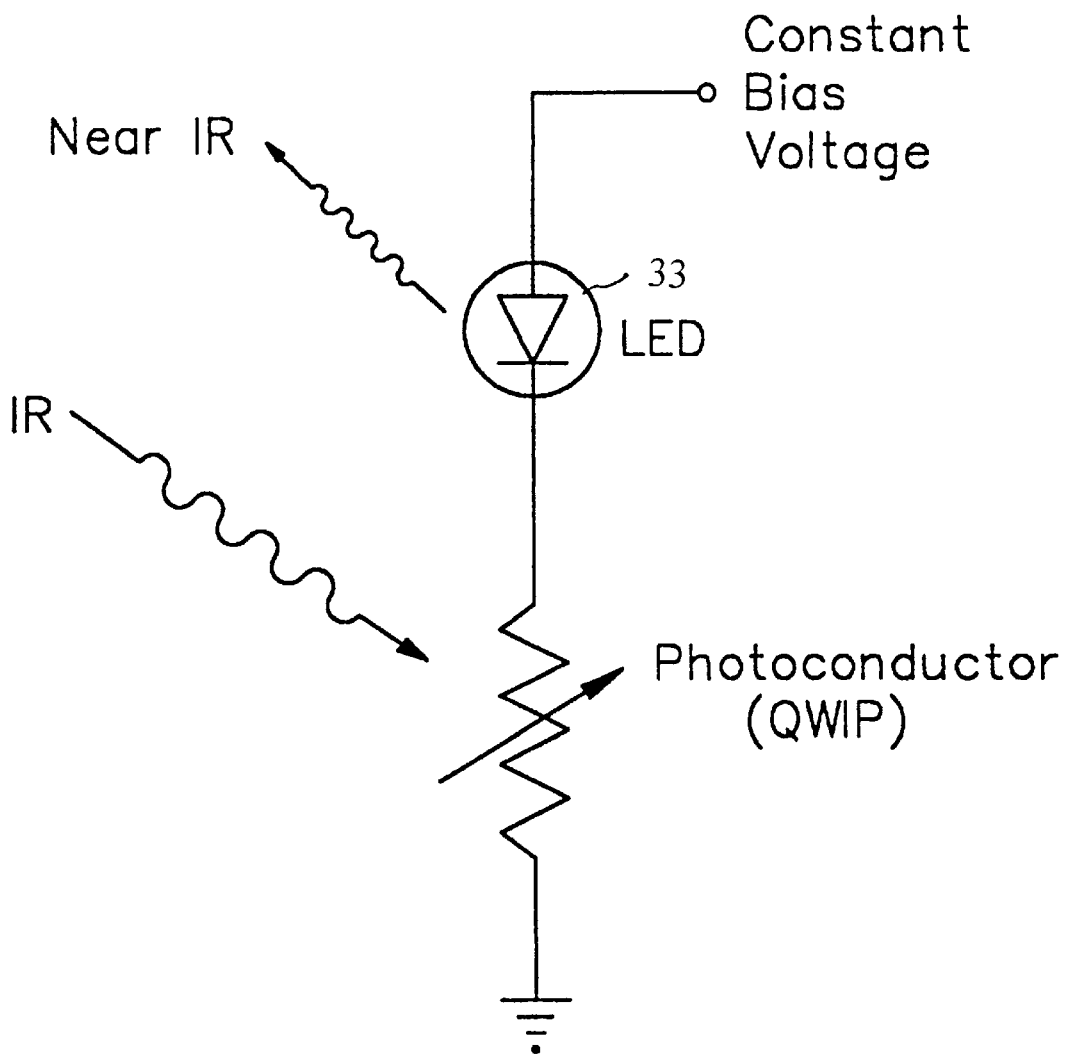
FIG. 3 is the equivalent circuit representation of the QWIP-LED up-converter. A QWIP as a photoconductor is connected in series with a near infrared or visible LED. A constant bias voltage is applied to turn both the QWIP and the LED into their operating points.
Figure 4A:
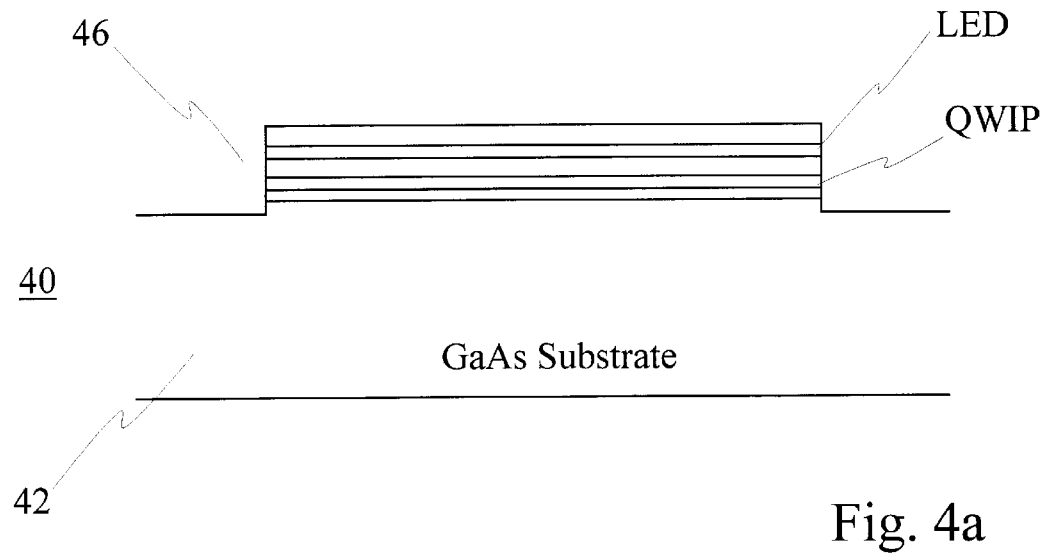
FIG. 4a is a side view (not to scale) of an imaging up-converter panel mesa structure on GaAs substrate with LED and QWIP.
Figure 4B:
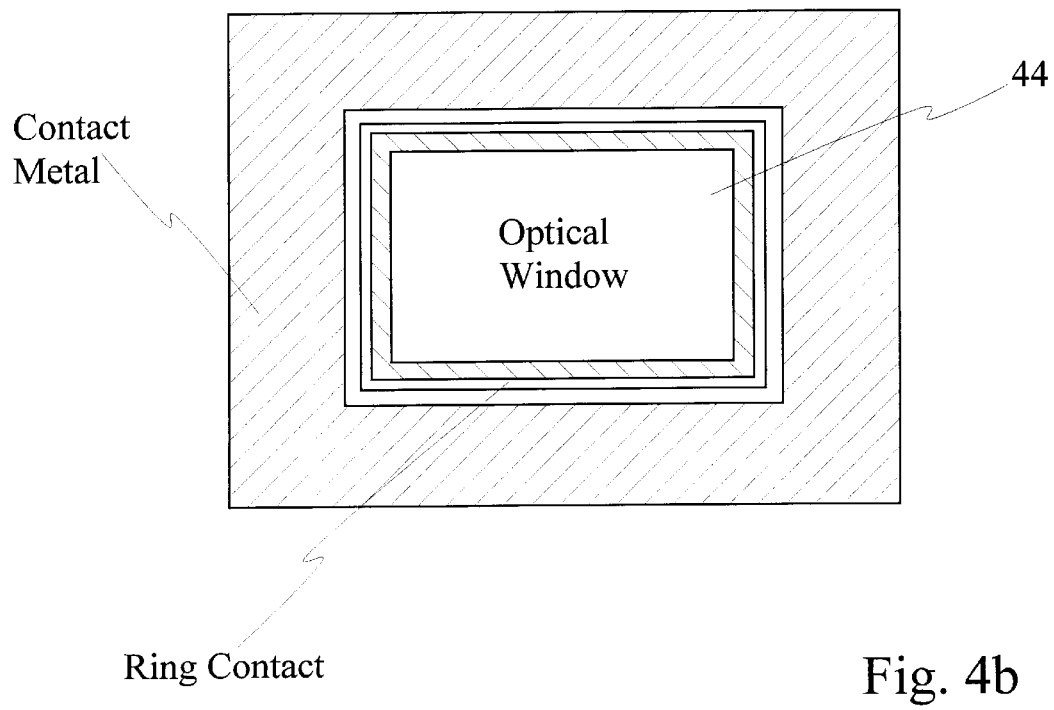
FIG. 4b is a top view (not to scale) illustrating an optical window, the top ring contact and the bottom contact.
Figure 4C:
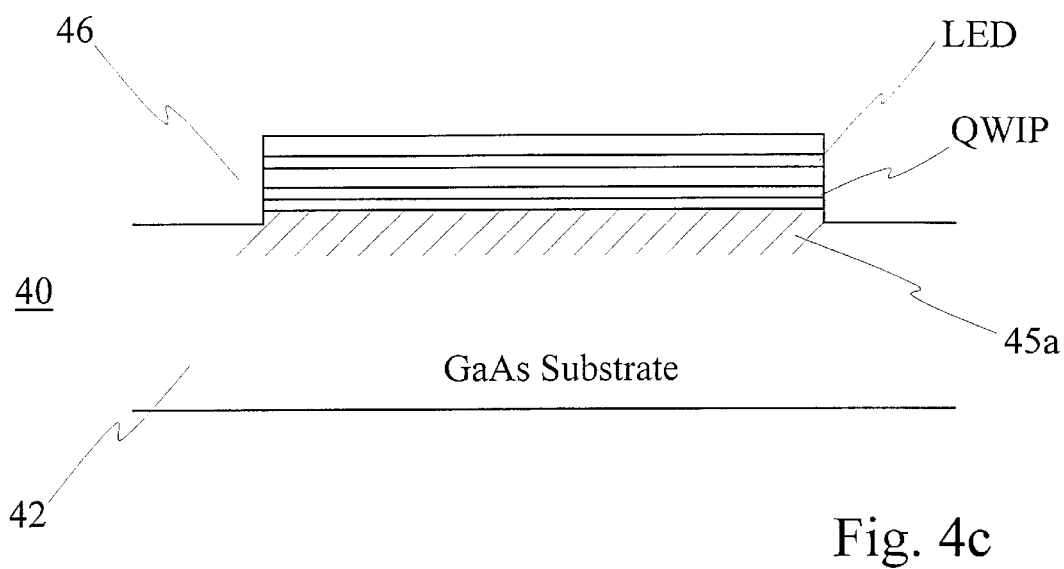
FIGS. 4c and 4d are cross sectional views (not to scale) illustrating two reflective devices in accordance with the invention.
Figure 4D:
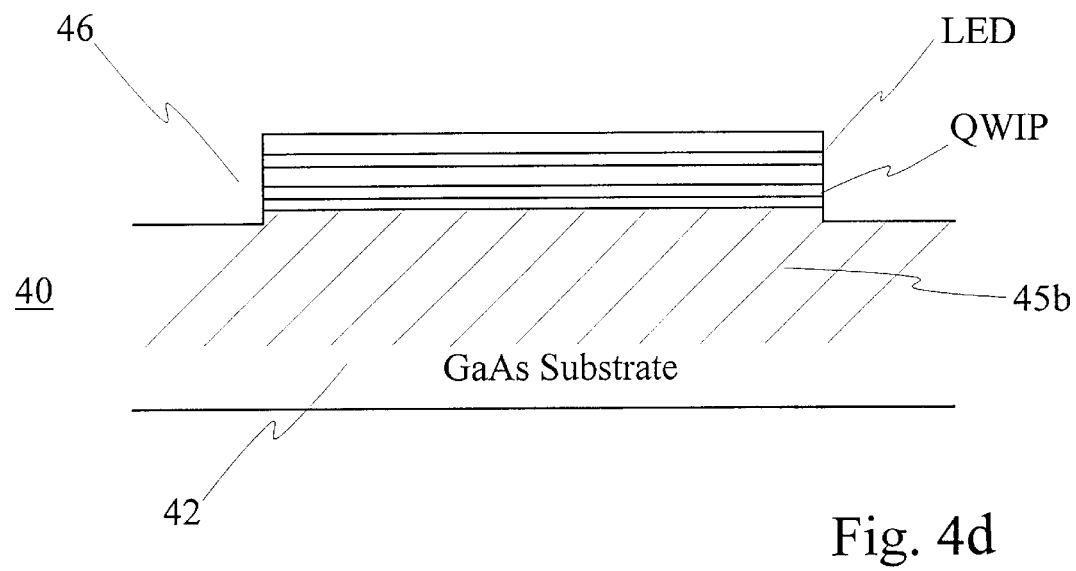

Given the up-conversion device, the QWIP-LED described above with its circuit representation shown in FIG. 3, a large diode with an optical window 44 as is shown in FIG. 4b can be used as an image up-conversion panel. In a first embodiment wherein a transmissive substrate is provided, and the device functions in transmission, the entire QWIP-LED structure 40 is very thin with a total thickness in 1–5 μm range; due to the QWIP-LED structure being very thin the cross-talk caused by photo-excited electron lateral spreading is negligible. Optical cross-talk caused by the emitted photon traveling laterally within the wafer can be reduced to a minimum by thinning the substrate 42 to under 50 μm and preferably under about 10 μm or even removing the entire substrate 42 leaving only the epitaxial layers 46. By providing a device wherein this cross talk or smearing is negligible, there is no need for pixelizing by providing an array of devices each corresponding to one pixel as in a conventional imaging array In other embodiments of the invention, this cross-talk or smearing can be eliminated by providing a QWIP-LED 40 that is designed to function in reflection or absorption rather than in transmission, with a common input/output port/face of the device. More specifically, in a second embodiment of the invention, where care is not taken to thin the substrate layer, or ensure nearly 100% transmissivity of FIR energy through the substrate, a reflective layer 45a can be incorporated adjacent the substrate or the QWIP-LED prior to growing the QWIP-LED layers as is shown in FIG. 4c. Alternatively, a substrate layer 45b having a high reflectivity can be used, as illustrated in FIG. 4d.

Figure 7:
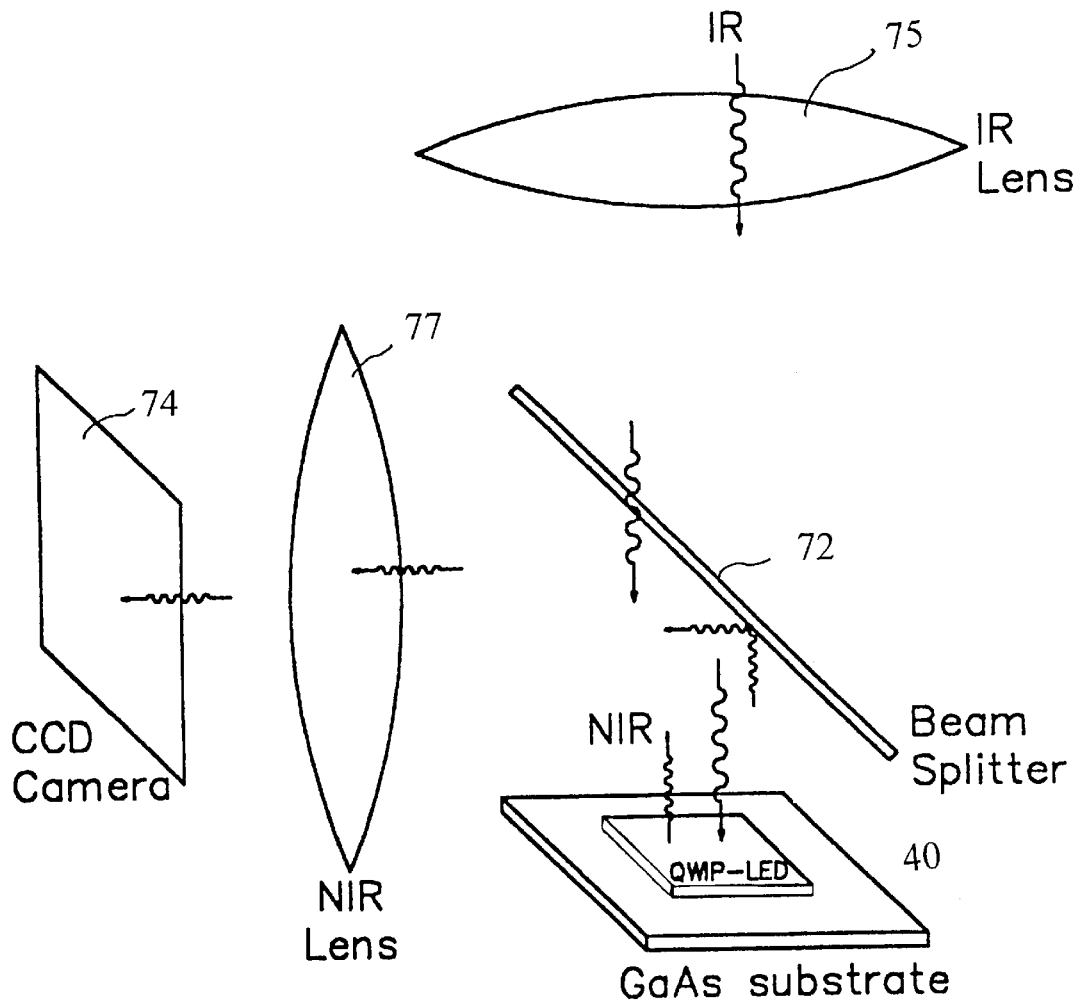
FIG. 7 is a schematic assembly of a QWIP-LED imaging up-converter panel with associated optical components and a CCD camera for infrared imaging.

In yet another embodiment of the invention, instead of providing a very thin substrate or an effectively reflective layer below the QWIP-LED, a substrate or QWIP that is highly absorptive can be provided to essentially eliminate smearing of the image produced. By providing an absorptive substrate or absorptive layer upon the substrate, any light entering this absorptive layer or the absorptive substrate, as may be the case, would be absorbed and would not re-enter the QWIP portion of the structure, thereby eliminating smearing of the image that would be caused by this unwanted light reaching the QWIP-LED portion of the device. Of course, providing an absorptive substrate would limit one to launching light to be up-converted into the same face of the device as is used to capture up-converted light, as shown in FIG. 7. Similarly, providing a reflective layer between the substrate and the QWIP-LED or providing a reflective substrate, would limit the input and output light receiving/transmitting face to be the same face of the device, as in FIG. 7.

The assembly of the imaging system is shown having appropriate lenses, a beam splitter 72, and a CCD camera 74. The IR lens 75 collects the IR light and focuses it onto the plane of the panel 40. The beam splitter 72 having high transmission for the IR and high reflection for the NIR or visible light is incorporated. The use of the beam splitter frees the backside of the panel for mounting onto a dewar cold finger. The NIR lens 77 maps the emission image onto the focal plane of the CCD camera 4. Preferably, the CCD camera 4 should have digital signal processing capability for background, gain and offset corrections in real time. Alternatively, in place of a CCD, other image capture means can be used. For example, photographic film can be provided to capture a NIR image of the up-converted image, or motion picture film may be used.

Along with the ease in fabrication this device in accordance with the invention provides a fill factor of approximately 100%. Furthermore the invention lends itself to use of all mature and demonstrated technologies avoiding complications encountered in a conventional system using HgCdTe or InSb and hybrid integration with a Si multiplexer.

Presently the largest commercial GaAs wafer has a diameter of approximately three inches. Limited by the wafer size and the defect density, one can therefore make very large panels in comparison with the conventional IR imaging focal plane arrays which are normally no larger than about 10×10 mm$^2$. The state-of-the-art GaAs-based MBE materials have very low defect density with largest laboratory tested diodes up to many millimeters by many millimeters in size.

Figure 5A:
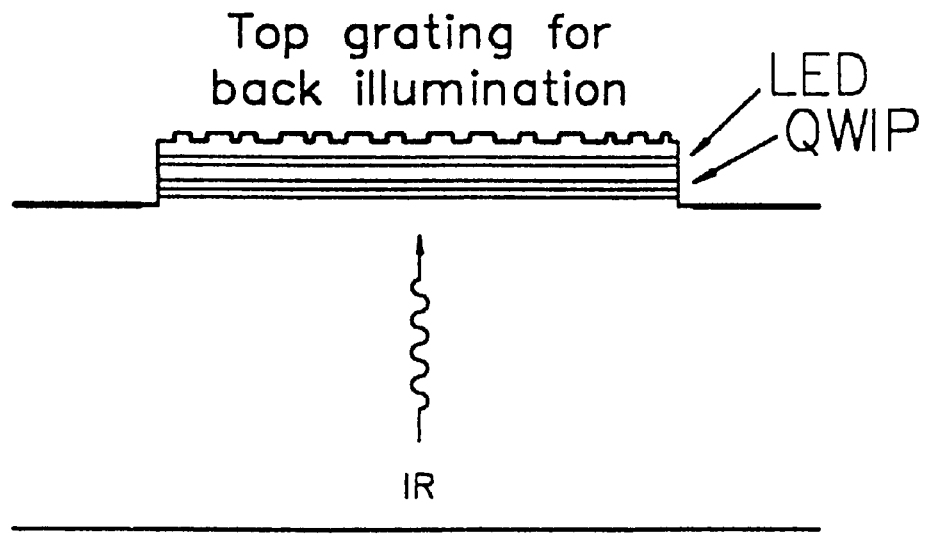
FIG. 5b and 5a illustrate a schematic devices (not to scale) mesa structure for (above) top illumination with thinned backside grating and for (below) backside illumination with top grating; in the latter case the device is mounted with the mesa side onto the cold finger of the dewar.
Figure 5B:
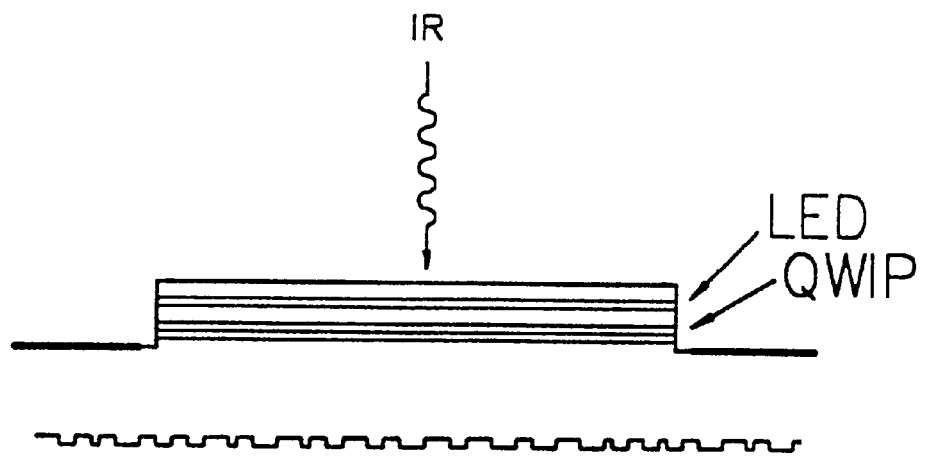
Figure 6:
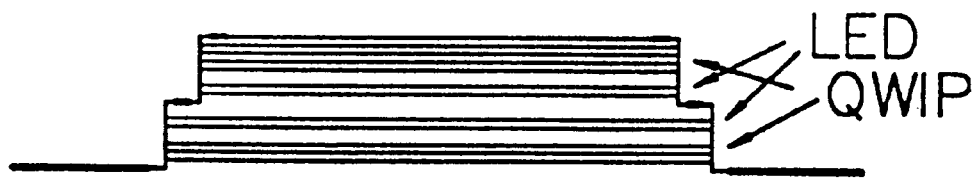
FIG. 6 is a cross section view (not to scale) of a two-color version of the panel, wherein the double mesa structure provides three separate electrical contacts for biasing the two QWIP-LED's independently with the middle lead being common.

For a p-QWIP integrated with a LED, the geometry schematically shown in FIGS. 4a can be a practical embodiment, whereas for a n-QWIP with LED, diffraction gratings are needed on top or bottom of the device panel shown in FIGS. 5a and 5b.

In practical IR imaging applications, it is often desirable to have multicolor or multispectral coverage in different wavelengths within the infrared. Note that for the above one-color QWIP with LED, only two electrical connections are required. Because of the simplicity, multicolor QWIP-LED versions are easily fabricated. FIG. 4 shows a two-color version. Detailed information relating to the understanding and design of a multicolor detector can be found in a recently issued U.S. patent in the name of the applicant, H. C. Liu issued as U.S. Pat. No. 5,646,421 issued Jul. 8, 1997 to the National Research Council of Canada hereby incorporated by reference.

In comparison to the one-color version, only one extra connection is needed. Two QWIP-LED's are connected in series with the LED side as a common lead. A double mesa structure provides the three electrical connections. The LEDs can be the same or different in their design to give the same or different emission wavelength.

H. C. Liu, the applicant, in the above cited book chapter teaches the basic design of high-performance QWIPs. Here an example is given of a GaAs/AlGaAs structure for $\lambda_{IR}=$ 9— $\mu$m The well is 5.9 nm GaAs and is doped with Si to about 5×10$^{11}$ cm$^{-2}$ and the barrier is 40.0 nm undoped Al$_{0.25}$Ga$_{0.75}$As. The number of wells should be greater than about 20 for high absorption. The larger the number of wells, the lower the detector noise, but practically 20 to 100 wells are used and we choose 50 wells in the preferred embodiment. The bottom GaAs contact layer is doped with Si to about 1.5×10$^{18}$ cm$^{-3}$ having a thickness 0.8 $\mu$m. The substrate for epitaxial growth is semi-insulating (100) GaAs.

The LED is subsequently grown after the last barrier of the QWIP. The LED technology is mature, and here we give an example of layers suitable for emission slightly below the GaAs bandgap at a wavelength of about 870 nm (77 K operation) in the NIR region. Layers, in growth sequence, are a 40.0 nm graded Al$_x$Ga$_{1-x}$As from x=0.25 to 0 10, a 30.0 nm GaAs buffer layer, a 9.0 nm In$_{0.1}$Ga$_{1-x}$As active layer, a 30.0 nm GaAs buffer layer, a 40.0 nm graded Al$_x$Ga$_{1-x}$As from x=0.10 to 0.25, a 50.0 nm p-type-doped Al$_{.25}$Ga$_{0.75}$As with doping of Be at 5×10$^{18}$ cm$^{-3}$ a 200.0 nm p-type-doped GaAs top contact layer with doping of Be at 10$^{19}$ cm$^{-3}$ Variations of the preferred embodiment can be easily designed for a wide IR range. QWIPs operating in 3–20 $\mu$m have been achieved so far in the laboratories. The design of LED is well-known with possible wavelength coverage in the NIR or visible spectrum.

Lenses and beam splitter are commercially available. For example, the IR lens and the beam splitter can be made of thin-film coated Ge, and off-the-shelf camera lenses are suited for the NIR.

A large variety of commercial Si 2D CCD arrays available, for example, those made by Dalsa Inc, 605 McMurray Road, Waterloo, Ontario N2V 2E9, Canada.

Semiconductors photodiodes (PDs), photoconductors (PCs) are widely available commercial products. Integrating a detector such as a PD or a PC with an LED (as described heretofore) for wavelength conversion is well known. Examples of devices are given by papers of Beneking et al. and Liu et al, and within patents of Pocholle et al. and Liu. These patents also teach method of fabricating imaging arrays made of a large number of elements corresponding to pixels.

Figure 8A:
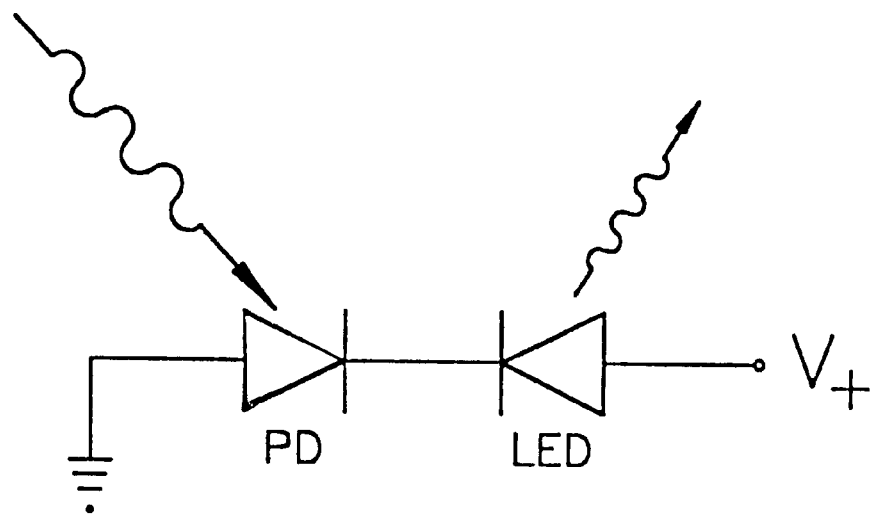
FIG. 8a is circuit diagram showing an up-conversion scheme wherein a photodiode (PD) is used as the detector.
Figure 8B:
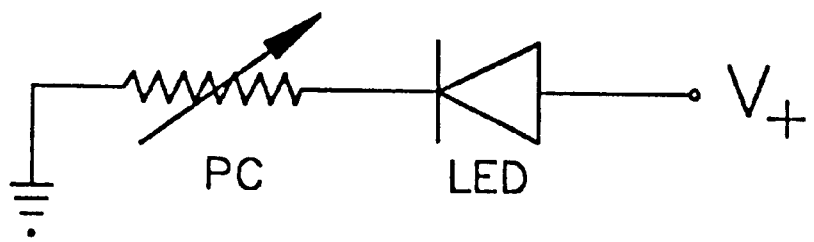
FIG. 8b is circuit diagram showing an up-conversion scheme wherein a photoconductor (PC) is used as the detector.

In an alternative embodiment of the invention an up-conversion device is shown where either a PD or a PC is connected in series with an LED. Referring now to FIG. 8a a device in the form of a biased PD is shown coupled in series with and LED and in FIG. 8b a PC is shown biased and in series with an LED. The PC or PD acts as the IR detector, whereas the LED emits in the NIR or visible spectrum compatible with the CCD response range. [Here, we designate "IR" for all wavelengths longer than the CCD response region (>1.1 $\mu$m).] A forward constant bias voltage (V+) is applied to the LED with the other side of the series grounded. An IR excitation of the detector decreases the resistance of the detector and thereby increases the voltage dropped across the LED, leading to an increase in the LED emission intensity. We have therefore converted the in-coming IR into an increase of NIR or visible emission. Note that for the photodiode case shown in FIG. 8(a), instead of connecting the two n-type sides together one can connect the two p-type sides, in which case the applied voltage should be negative in polarity. Note also that instead of grounding the detector side one can ground the LED side with the appropriate change of the bias polarity. Similarly, for the photoconductor case shown in FIG. 8(b), one can reverse the polarity of the LED and the bias voltage, in which case the photoconductor should work on hole carrier conduction process. Also similarly, the grounding can be either the detector or the LED side. The general requirement of biasing and grounding is such that the LED must be forwardly biased.

Figure 8C:
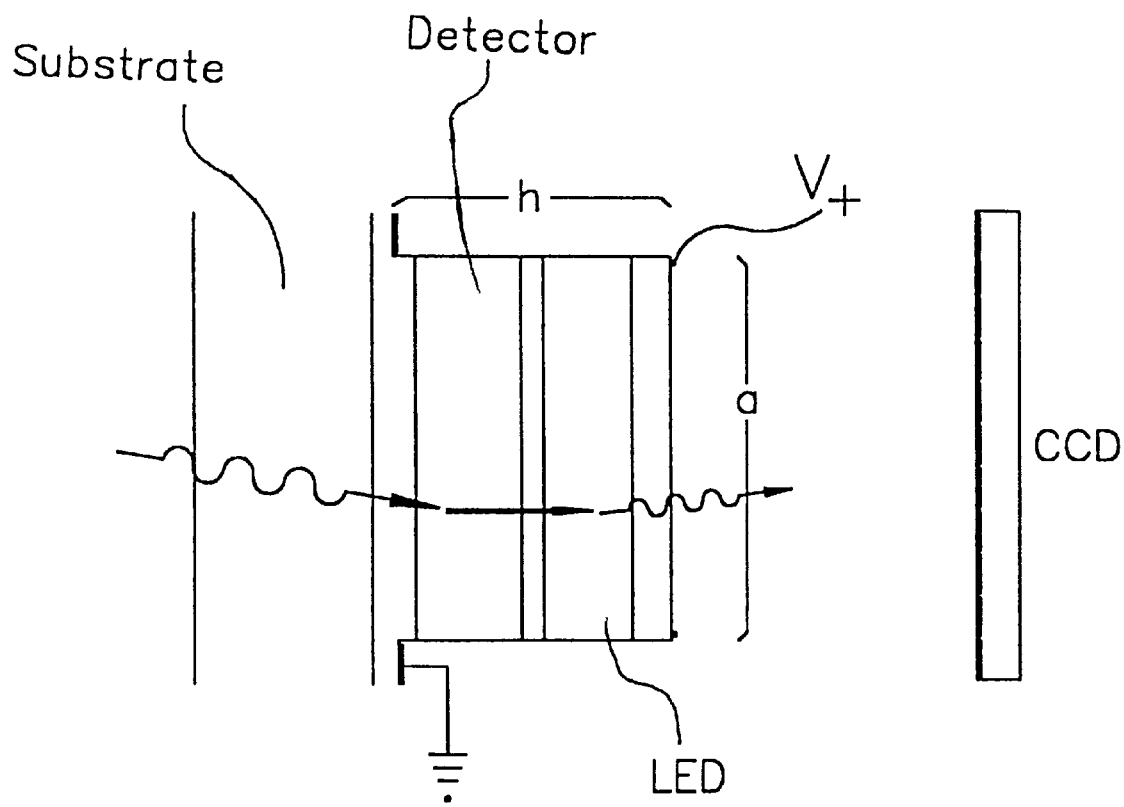
FIG. 8c is a diagram showing a large area mesa device and a CCD (shown not to scale).

The essential elements of achieving a pixelless imaging device in accordance with this embodiment of the invention are shown in FIG. 8(c). A simple two-terminal mesa device on a substrate is shown. The up-conversion device is made sufficiently large in area for an IR image, and a CCD detects the emitted image.

The key requirements for up-converting the IR image into the LED emission image with negligible distortion, smearing, and cross-talk in accordance with this embodiment as follows. (1) The entire active part of the detector-LED structure must be thin. (The figure is not drawn to scale: the height of the mesa should be much smaller than the dimension of the device area, a >>h.) In practice, due to the diffraction limit in optical elements, a thickness comparable to or less than the IR wavelength is sufficient, $h >> \lambda_{IR}$ or $h < \lambda_{IR})2$. The photoexcited carrier in the detector must reach the LED active region with negligible motion in the directions perpendicular to the applied biasing field. To minimize the perpendicular smearing, the middle layer connected the detector and the LED should be thin and nearly completely depleted. Again, due to the diffraction limit, a perpendicular motion of less than the wavelength is negligible in practice.

The molecular beam epitaxy (MBE) and other similar or related epitaxial growth technologies can produce devices satisfying the above two requirements. The hetero-system of InGaAs-InAlAs or of InGaAs-InP based on InP is ideal for implementing the up-conversion device covering the part of the IR region of 1.8–1.1 μm. A new developed ternary alloy, InTlP, which is grown on InP and is nearly lattice matched to InP is capable to cover the entire infrared range. Presently the largest commercial InP wafer has a diameter of three inches. Limited by the wafer size and the defect density, one can therefore make very large pixelless devices in comparison with the conventional IR imaging focal plane arrays which are normally no larger than about 10 X 10 mm². In summary, the prior art device includes a plurality of QWIP-LEDs having a window of approximately 2 mm by 2 mm or greater for passing up-converted light, wherein a CCD array is positioned to capture pixelized intensity values, such that one QWIP-LED provides a single value to one or more CCD elements positioned to capture light. Essentially, the structure taught by the applicant in the previous patent provides a means of pixelizing an image by providing a plurality of QWIP-LEDs on a single structure. In an alternative embodiment a photodiode (PD) or a photoconductor (PC) is coupled on a substrate with a large LED for providing an up-converted pixelless image.

The present invention reduces the cost substantially of providing an image having a plurality of intensity values without the expense of pixelizing the image by providing an array of QWIP-LEDs to provide individually varying intensity values. It also allows the same device to be used with a different number of quantizations. The CCD varies based on design requirements such as cost and resolution. By way of the present invention, a variation across two dimensions of the panel is achievable with a known relation to the incoming infrared beam wherein a single QWIP-LED can provide a plurality of different signals to a plurality of different cells in a CCD in response to the input infrared beam that varies across two dimensions of its cross section.

What is claimed is:

1. A far infrared (FIR) to near infiared (NIR) light converter comprising;
a single quantum well intersubband photodetector (QWIP) integrated vertically with a single light emitting diode (LED) for providing an image carried by an output up-converted beam of light in response to a beam of FIR energy provided to the QWIP; and,
detection means optically coupled to the single LED for capturing a plurality of values from the single LED corresponding to said image.

2. A far infrared (FIR) to near infrared (NIR) light converter as defined in claim 1, wherein the single LED has a light emitting face having a dimension of approximately greater than 2 mm×2 mm, and where the detection means comprise an array of elements each having a receiving face dimension of substantially less than 2 mm×2 mm.

3. A far infrared (FIR) to near infrared (NIR) light converter as defined in claim 1, wherein the detection means optically coupled to the single LED for capturing a plurality of values comprises an array of CCD elements.

4. A far infrared (FIR) to near infrared (NIR) light converter as defined in claim 3, wherein in operation, when a beam of FIR energy corresponding to a captured image is up-converted a plurality of CCD elements coupled to the single LED detect a plurality of different values.

5. A far infrared (FIR) to near infrared (NIR) light converter as defined in claim 1 including a substrate for supporting the QWIP and the LED, wherein the substrate has a thickness of less than or equal to 50 μm for substantially minimizing distortion within said image.

6. A far infrared (FIR) to near infrared (NIR) light converter as defined in claim 5, wherein the substrate or a layer adjacent the substrate is one of highly reflective and highly absorptive for substantially minimizing distortion within said image.

7. An imaging chip comprising:;
a single integrated device including:
    a photodiode (PD) or photoconductor (PC) integrated with a single LED, the LED having an emitting surface dimension of approximately 2 mm×2 mm or greater,
image capture means positioned to capture a plurality of different intensity values from the single LED.

8. A method of imaging comprising:
providing an imaging chip, including a single up-conversion means, said up-conversion means including one of a photodiode and a photoconductor, and a single light emitting diode, said single light emitting diode having a dimension across its light emitting surface of approximately equal to or greater than 2 mm×2 mm;
providing an image in the form of FIR energy to said single up-conversion means, and, providing converted NIR energy from the single light emitting diode to a means for capturing a plurality of different values from the single light emitting diode, corresponding to the image.

9. A far infrared (FIR) to near infrared (NIR) light converter comprising: a single quantum well intersubband photodetector (QWIP) on a substrate, the QWIP having a light receiving surface of approximately 2 mm×2 mm or greater to provide a plurality of electrical signals corresponding to input light representative of an image, and, an array of detectors disposed to for receiving signals corresponding to the plurality of electrical signals to detect the image.

* * * * *